United States Patent
Jo

(10) Patent No.: US 8,710,895 B2
(45) Date of Patent: Apr. 29, 2014

(54) LEVEL-SHIFT CIRCUIT, ELECTRO-OPTICAL DEVICE, AND LEVEL SHIFT METHOD

(75) Inventor: Hiroaki Jo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 1157 days.

(21) Appl. No.: 12/040,022

(22) Filed: Feb. 29, 2008

(65) Prior Publication Data

US 2008/0224755 A1     Sep. 18, 2008

(30) Foreign Application Priority Data

Mar. 12, 2007   (JP) ................. 2007-061345

(51) Int. Cl.
*H03L 5/00*    (2006.01)
*H03K 3/356*   (2006.01)

(52) U.S. Cl.
CPC .................. *H03K 3/356* (2013.01)
USPC ...................................... 327/333

(58) Field of Classification Search
CPC ...................................... H03K 3/356
USPC ............. 327/333; 326/68, 80, 81; 365/189.11
See application file for complete search history.

(56) References Cited

U.S. PATENT DOCUMENTS

| | | | | |
|---|---|---|---|---|
| 5,387,828 A | * | 2/1995 | Nakano | 326/68 |
| 6,563,357 B1 | * | 5/2003 | Hsu et al. | 327/212 |
| 6,819,137 B1 | * | 11/2004 | Wang et al. | 326/68 |
| 7,132,856 B2 | * | 11/2006 | Hsu et al. | 326/81 |
| 7,212,059 B2 | * | 5/2007 | Kubota et al. | 327/333 |
| 7,511,551 B2 | * | 3/2009 | Lee | 327/333 |
| 7,515,484 B2 | * | 4/2009 | Seong | 365/189.05 |

FOREIGN PATENT DOCUMENTS

| | | |
|---|---|---|
| JP | A-64-44619 | 2/1989 |
| JP | 7-98983 | 4/1995 |

* cited by examiner

*Primary Examiner* — Sibin Chen
(74) *Attorney, Agent, or Firm* — Oliff PLC

(57) ABSTRACT

A level shift circuit is for converting a level of input signal which has a logic level at a first input electric potential and a logic level at a second input electric potential and generating an output signal which a logic level at a first output electric potential corresponding to the first input electric potential and logic level at a second output electric potential corresponding to the second input electric potential.

6 Claims, 6 Drawing Sheets

US 8,710,895 B2

LEVEL-SHIFT CIRCUIT, ELECTRO-OPTICAL DEVICE, AND LEVEL SHIFT METHOD

This application claims priority from Japanese Patent Application No. 2007-061345 filed in the Japanese Patent Office on Mar. 12, 2007, the entire disclosure of which is hereby incorporated by reference in its entirety.

BACKGROUND

1. Technical Field

The present invention relates to techniques for shifting a level of an input signal.

2. Related Art

A level-shift circuit for shifting a level of an input signal to generate an output signal having a shifted level is known. The level-shift circuit shown in FIG. 9 is disclosed in JP-A-7-98983 (FIG. 8). The level shift circuit includes a latch circuit having two inverters at an output stage. A p-channel transistor and an n-channel transistor are connected to an input node of the latch circuit. An input signal is supplied to the p-channel transistor and the n-channel transistor via two capacitive elements. When a threshold voltage of the p-channel transistor is Vthp, the gate is biased to VCC−Vthp by a resistor. When a threshold voltage of the n-channel transistor is Vthn, the gate is biased to VEF+Vthn by a resistor. Thus, when the level of the input signal rises, the n-channel transistor is changed to be in an ON state in synchronization with the rising edge of the input signal, and then the electric potential of the input node of the latch circuit is changed to be VEE. When the level of the input signal falls, the p-channel transistor is changed to be in an ON state in synchronization with the falling edge of the input signal, and then the electric potential of the input node of the latch circuit is changed to be VCC. Thus, an output signal is generated by shifting the level of the input signal.

However, a level-shift circuit of the related art has problems described below. First, because two capacitive elements are needed in the level-shift circuit of the related art, if such a level-shift circuit is built in an integrated circuit (IC), the footprint of the level-shift circuit becomes large. Second, because the latch circuit is inverted by using only a pulse supplied to the input node, if variations occur in driving characteristics of transistors while the transistors are being manufactured, the electric potential of the input node may not be changed sufficiently, thereby causing the level-shift circuit to operate improperly.

SUMMARY

An advantage of some aspects of the invention is that it provides a level-shift circuit which has a simple structure and which tends not to operate improperly.

A level shift circuit according to a first aspect of the invention is for converting a level of an input signal which has a logic level at a first input electric potential (for example, VSS1 shown in FIG. 2) and a logic level at a second input electric potential (for example, VDD1 shown in FIG. 2) and generating an output signal which has a logic level at a first output electric potential (for example, VSS2 shown in FIG. 2) corresponding to the first input electric potential and a logic level at a second output electric potential (for example, VDD2 shown in FIG. 2) corresponding to the second input electric potential. The level shift circuit includes a first power-supply node to which the first output electric potential is supplied, a second power-supply node to which the second output electric potential is supplied, a latch unit having an input node (for example, N1 shown in FIG. 2) and an output node (for example, N2 shown in FIG. 2) from which the output signal is output, the latch unit being configured to receive power from the first power-supply node and the second power-supply node and to maintain, if an electric potential of the input node is identical to one of the first output electric potential and the second output electric potential, an electric potential of the output node to be the other one of the first output electric potential and the second output electric potential, a switching element (for example, Tnd shown in FIG. 2) that is provided between the first power-supply node and the input node and controlled to be in an ON state or an OFF state, a control unit (for example, C1 and R1 shown in FIG. 2) that controls the switching element to be in the ON state at a timing corresponding to the time when a level of the input signal changes from the first input electric potential to the second input electric potential, and a setting unit (for example, Tnp shown in FIG. 2) that changes an electric potential of the output node to the first output electric potential in a predetermined period just before the logic level of the input signal changes.

There are two ways in which the logic level of the input signal is changed. In the first way, the logic level of the input signal changes from the first input electric potential to the second input electric potential. In the second way, the logic level of the input signal changes from the second input electric potential to the first input electric potential. In the first way, the level of the output signal is changed from the first output electric potential to the second output electric potential. In the second way, the level of the output signal is changed from the second output electric signal to the first output electric potential. Before the logic level of the input signal is changed, the setting unit sets an electric potential of the output node to the first output electric potential. After the electric potential is set, if the logic level of the input signal is changed in the second way, the electric potential of the input node does not have to be changed. If the logic level of the input signal is changed in the first way the electric potential of the input node needs to be the first output electric potential and that of the output node needs to be the second output electric potential. Because the control unit changes the switching element to be in the ON state if the logic level of the input signal is changed in the first way, the electric potential of the input node is set to the first output electric potential. Thus, because the level shift circuit according to the first aspect of the invention sets an electric potential of the output node before the level of the input signal is changed, the logic level of the output signal can be assuredly inverted. Moreover, because the logic level of the input node is changed only if the logic level of the input signal is changed in the first way, a structure of the level shift circuit can be simplified.

In the above-described level shift circuit, it is preferable that, as a specific example, the control unit includes a bias circuit that biases a control terminal of the switching element to be at the first output electric potential, and a capacitive element that includes one terminal to which the control terminal of the switching element is connected and another terminal to which the input signal is supplied. In this case, because the number of the capacitive elements can be one, the circuit scale of the level shift circuit can be reduced. In particular, in the case where the level shift circuit is mounted in an IC, the footprint of the level shift circuit can be reduced. Note that, the bias circuit may include, for example, a resistor, a transistor, a diode, or the like.

In the above-described level shift circuit, it is preferable that, as a specific example, the setting unit includes a transistor which is provided between the first power-supply node and the output node, and a control signal (for example, PRC shown in FIG. 2) whose logic level is at the first output electric potential or at the second output electric potential and whose level becomes the second output electric potential in the predetermined period just before the logic level of the input signal changes is supplied to the gate of the transistor. In this case, when the level of the control signal becomes equal to the second output electric potential, the transistor is changed to be in the ON state. As a result, an electric potential of the output node is set to the first output electric potential.

A level shift circuit according to a second aspect of the invention is for converting a level of an input signal which has a logic level at a first input electric potential and a logic level at a second input electric potential and generating an output signal which has a logic level at a first output electric potential corresponding to the first input electric potential and a logic level at a second output electric potential corresponding to the second input electric potential. The level shift circuit includes a first power-supply node to which the first output electric potential is supplied, a second power-supply node to which the second output electric potential is supplied, a latch unit having an input node and an output node from which the output signal is output, the latch unit being configured to receive power from the first power-supply node and the second power-supply node and to maintain, if an electric potential of the input node is identical to one of the first output electric potential and the second output electric potential, an electric potential of the output node to be the other one of the first output electric potential and the second output electric potential, a first switching element (for example, Tnd shown in FIG. 4) that is provided between the first power-supply node and the input node and controlled to be in an ON state or an OFF state, a second switching element (for example, Tpd shown in FIG. 4) that is provided between the second power-supply node and the output node and controlled to be in an ON state or an OFF state, a first control unit (for example, C1 and R1 shown in FIG. 4) that controls the first switching element to be in the ON state at a timing corresponding to the time when a level of the input signal changes from the first input electric potential to the second input electric potential, a second control unit (for example, C2 and R2 shown in FIG. 4) that controls the second switching element to be in the ON state at the timing corresponding to the time when the level of the input signal changes from the first input electric potential to the second input electric potential, a first setting unit (for example, Tnp shown in FIG. 4) that changes an electric potential of the output node to the first output electric potential in a predetermined period just before the logic level of the input signal changes, and a second setting unit (for example, Tpp shown in FIG. 4) that changes an electric potential of the input node to the second output electric potential in the predetermined period just before the logic level of the input signal changes.

There are two ways in which the logic level of the input signal is changed. In the first way, the logic level of the input signal changes from the first input electric potential to the second input electric potential. In the second way, the logic level of the input signal changes from the second input electric potential to the first input electric potential In the first way, the level of the output signal is changed from the first output electric potential to the second output electric potential. In the second way, the level of the output signal is changed from the second output electric signal to the first output electric potential. Before the logic level of the input signal is changed, the first setting unit sets an electric potential of the output node to the first output electric potential and the second setting unit sets an electric potential of the input node to the second output electric potential. Thus, because such potentials are set at both the input node and the output node, memory content of the latch unit can be assuredly set. After the memory content is set, if the logic level of the input signal is changed in the first way, because the first control unit changes the first switching element to be in the ON state, the electric potential of the input node is set to the first output electric potential. Moreover, because the second control unit changes the second switching element to be in the ON state, the electric potential of the output node is set to the second output electric potential. Thus, because the level shift circuit according to the second aspect of the invention sets a potential of the output node and that of the input node before the level of the input signal is changed, the logic level of the output signal can be assuredly inverted.

In the above-described level shift circuit, it is preferable that the first control unit includes a first bias circuit that biases a control terminal of the first switching element to be at the first output electric potential, and a first capacitive element that includes one terminal to which the control terminal of the first switching element is connected and another terminal to which the input signal is supplied, and the second control unit includes a second bias circuit that biases a control terminal of the second switching element to be at the second output electric potential, and a second capacitive element that includes one terminal to which the control terminal of the second switching element is connected and another terminal to which an inverted input signal obtained by inverting the logic level of the input signal is supplied. In this case, two capacitive elements are needed; however, not only the logic level of the input node but also that of the output node can be managed. If only the logic level of the input node is managed, a delay time of the latch unit is required until changing of the logic level of the input node is reflected in the output signal. However, such time is not required in the level shift circuit according to the second aspect of the invention, and thus a high-speed response output signal can be generated.

In the above-described level shift circuit, it is preferable that the first setting unit includes a first transistor which is provided between the first power-supply node and the output node, and a control signal whose logic level is at the first output electric potential or at the second output electric potential and whose level becomes the second output electric potential in the predetermined period just before the logic level of the input signal changes is supplied to the gate of the first transistor, and the second setting unit includes a second transistor which is provided between the second power-supply node and the input node, and an inverted control signal which is obtained by inverting the logic level of the control signal and whose level becomes the first output electric potential in the predetermined period just before the logic level of the input signal changes is supplied to the gate of the second transistor. In this case, if the level of the control signal becomes equal to the second output electric potential, the first transistor is changed to be in an ON state, and thus an electric potential of the output node is set to the first output electric potential. If the level of the second control signal becomes equal to the first output electric potential, the second transistor is changed to be in an ON state, and an electric potential of the input node is set to the second output electric potential.

Next, a level shift circuit according to a third aspect of the invention is for converting a level of an input signal which has a logic level at a first input electric potential and a logic level at a second input electric potential and generating an output signal which has a logic level at a first output electric potential corresponding to the first input electric potential and a logic level at a second output electric potential corresponding to the second input electric potential. The level shift circuit includes a first power-supply node to which the first output electric potential is supplied, a second power-supply node to which the second output electric potential is supplied, a latch unit having an input node and an output node from which the output signal is output, the latch unit being configured to receive power from the first power-supply node and the second power-supply node and to maintain, if an electric potential of the input node is identical to one of the first output electric potential and the second output electric potential, an electric potential of the output node to be the other one of the first output electric potential and the second output electric potential a first switching element that is provided between the first power-supply node and the input node and controlled to be in an ON state or an OFF state, a second switching element that is provided between the second power-supply node and the input node and controlled to be in an ON state or an OFF state, a third switching element that is provided between the first power-supply node and the output node and controlled to be in an ON state or an OFF state, a fourth switching element that is provided between the second power-supply node and the output node and controlled to be in an ON state or an OFF state, a first control unit that controls the first switching element to be in the ON state at a timing corresponding to the time when an electric potential of the input signal changes from the first input electric potential to the second input electric potential, a second control unit that controls the second switching element to be in the ON state at a timing corresponding to the time when the electric potential of the input signal changes from the second input electric potential to the first input electric potential, a third control unit that controls the third switching element to be in the ON state at the timing corresponding to the time when an electric potential of the input signal changes from the first input electric potential to the second input electric potential, and a fourth control unit that controls the fourth switching element to be in the ON state at the timing corresponding to the time when the electric potential of the input signal changes from the second input electric potential to the first input electric potential.

There are two ways in which the logic level of the input signal is changed. In the first way, the logic level of the input signal changes from the first input electric potential to the second input electric potential. In the second way, the logic level of the input signal changes from the second input electric potential to the first input electric potential. In the first way, the logic level of the output signal needs to be changed from the first output electric potential to the second output electric potential. In the second way, the logic level of the output signal needs to be changed from the second output electric potential to the first output electric potential. According to the third aspect of the invention, in the first way, the input node is changed to be at the first output electric potential, and the output node is changed to be at the second output electric potential. In the second way, the input node is changed to be at the second output electric potential and the output node is chanced to be at the first output electric potential. Thus, because both the logic level of the input node and that of the output node are changed, operational reliability can be improved. In addition, if only the logic level of the input node is managed, a delay time of the latch unit is required until changing of the logic level of the input node is reflected in the output signal. However, such time is not required in the level shift circuit according to the third aspect of the invention, and thus a high-speed response output signal can be generated.

As a specific example of the level shift circuit described above, it is preferable that the first control unit includes a first bias circuit that biases a control terminal of the first switching element to be at the first output electric potential, and a first capacitive element that includes one terminal to which the control terminal of the first switching element is connected and another terminal to which the input signal is supplied, the second control unit includes a second bias circuit that biases a control terminal of the second switching element to be at the second output electric potential, and a second capacitive element that includes one terminal to which the control terminal of the second switching element is connected and another terminal to which the input signal is supplied, the third control unit includes a third bias circuit that biases a control terminal of the third switching element to be at the first output electric potential, and a third capacitive element that includes one terminal to which the control terminal of the third switching element is connected and another terminal to which an inverted input signal obtained by inverting the logic level of the input signal is supplied, and the fourth control unit includes a fourth bias circuit that biases a control terminal of the fourth switching element to be at the second output electric potential, and a fourth capacitive element that includes one terminal to which the control terminal of the fourth switching element is connected and another terminal to which the inverted input signal is supplied. In this case, four capacitive elements are needed, however, an electric potential which should be maintained by the latch circuit can be set for each of the input node and the output node. If only the logic level of the input node is managed, a delay time of the latch unit is required until changing of the logic level of the input node is reflected in the output signal. However, such time is not required in the level shift circuit according to the third aspect of the invention, and thus a high-speed response output signal can be generated.

In the above-described level shift circuit, it is preferable that the latch unit further includes a first inverter whose input terminal is connected to the input node and whose output terminal is connected to the output node, and a second inverter whose input terminal is connected to the output node and whose output terminal is connected to the input node. In this case, the logic level of the output node is supplied as feedback to the input node by the second inverter. Thus, an electric potential can be assuredly maintained.

Next, an electro-optical device according to a fourth aspect of the invention includes the above-described level shift circuit, and it is preferable that a level of a part of a signal supplied from outside the electro-optical device is converted by using the level shift circuit. The electro-optical device according to the fourth aspect of the invention can be employed as a display device which typically displays an image, and can also be employed as a line head used in an optical-writing image forming apparatus (for example, a printer) other than the display device.

Next, inventive methods performed by the above-described level shift circuits will be described. Advantages in this case are similar to those of the above-described level shift circuit.

A level shift method according to a fifth aspect of the invention is for converting a level of an input signal which has a logic level at a first input electric potential and a logic level at a second input electric potential and generating an output signal which has a logic level at a first output electric potential corresponding to the first input electric potential and a logic level at a second output electric potential corresponding to the second input electric potential by using a latch circuit which includes an input node and an output node and maintains, if an electric potential of the input node is identical to one of the first output electric potential and the second output electric potential, an electric potential of the output node to be the other one of the first output electric potential and the second output electric potential. The level shift method includes setting the electric potential of the output node to the first output electric potential in a predetermined period just before the logic level of the input signal changes, and changing the electric potential of the input node to the first output electric potential in synchronization with a timing corresponding to the time when the logic level of the input signal changes from the first input electric potential to the second input electric potential.

A level shift method according to a sixth aspect of the invention is for converting a level of an input signal which has a logic level at a first input electric potential and a logic level at a second input electric potential and generating an output signal which has a logic level at a first output electric potential corresponding to the first input electric potential and a logic level at a second output electric potential corresponding to the second input electric potential by using a latch circuit which includes an input node and an output node and maintains, if an electric potential of the input node is identical to one of the first output electric potential and the second output electric potential, an electric potential of the output node to be the other one of the first output electric potential and the second output electric potential. The level shift method includes setting the electric potential of the output node to the first output electric potential and setting the electric potential of the input node to the second output electric potential in a predetermined period just before the logic level of the input signal changes, and changing the electric potential of the input node to the first output electric potential and changing the electric potential of the output node to the second output electric potential in synchronization with a timing corresponding to the time when the logic level of the input signal changes from the first input electric potential to the second input electric potential.

A level shift method according to a seventh aspect of the invention is for converting a level of an input signal which has a logic level at a first input electric potential and a logic level at a second input electric potential and generating an output signal which has a logic level at a first output electric potential corresponding to the first input electric potential and a logic level at a second output electric potential corresponding to the second input electric potential by using a latch circuit which includes an input node and an output node and maintains, if an electric potential of the input node is identical to one of the first output electric potential and the second output electric potential, an electric potential of the output node to be the other one of the first output electric potential and the second output electric potential. The level shift method includes changing the electric potential of the input node to the first output electric potential and changing the electric potential of the output node to the second output electric potential in synchronization with a timing corresponding to the time when the logic level of the input signal is changed from the first input electric potential to the second input electric potential, and changing the electric potential of the input node to the second output electric potential and changing the electric potential of the output node to the first output electric potential in synchronization with a timing corresponding to the time when the logic level of the input signal is changed from the second input electric potential to the first input electric potential.

BRIEF DESCRIPTION OF THE DRAWINGS

The invention will be described with reference to the accompanying drawings, wherein like numbers reference like elements.

DETAILED DESCRIPTION OF EMBODIMENTS

1. First Embodiment

Figure 1:
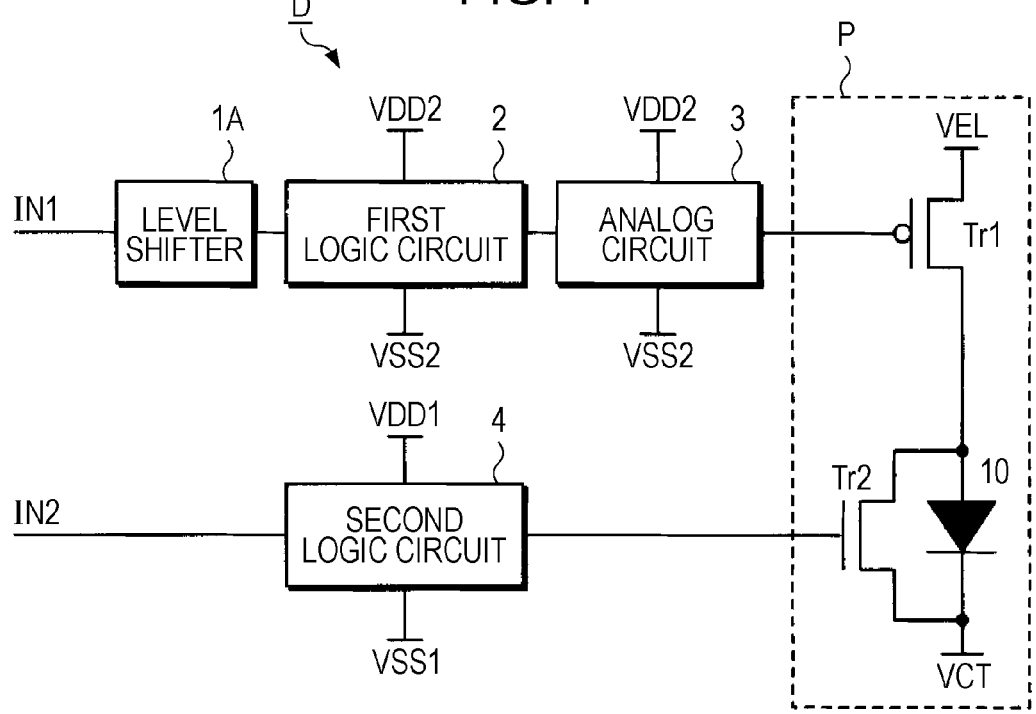
FIG. 1 is a block diagram showing a structure of an electro-optical device according to a first embodiment of the invention.

FIG. 1 is a block diagram showing a structure of an essential portion of an electro-optical device D according to a first embodiment of the invention. The electro-optical device D is used as, for example, a display device. A pixel circuit P has a structure in which a driving transistor Tr1 and a light-emitting element 10 are connected in series between a node to which a high electric potential VEL is supplied and a node to which a low electric potential VCT is supplied. The light-emitting element 10 is an element which emits light at an intensity corresponding to a driving current supplied from the driving transistor Tr1. For example, an organic light-emitting diode (OLED) element can be used as the light-emitting element 10. A light-emission control transistor Tr2 is connected to the light-emitting element 10 so as to be in parallel with the light-emitting element 10. When the light-emission control transistor Tr2 is changed to be in an ON state, the driving current flows through the light-emission control transistor Tr2 and thus the light-emitting element 10 is turned off. Note that a plurality of pixel circuits P are arranged in a matrix in the electro-optical device D. In this scheme, because the light-emission control transistor Tr2 is not provided in series between the driving transistor Tr1 and the light-emitting element 10, power consumption is reduced during light emission; however, the same amount of current is consumed while no light is emitted. This leads to reduction of deviation in a power-supply voltage and unevenness of luminance such as cross talk or the like.

A first input signal IN1 and a second input signal IN2 have a power-supply potential VSS1 as a low level and a power-supply potential VDD1 as a high level. The driving transistor Tr1 is operated in the saturated region. Thus, for example, if VEL=18 V, the level of a driving signal supplied to the gate of the driving transistor Tr1 should be 13 V to 18 V. If VCT=0 V, there is no problem if the light-emission control transistor Tr2 is driven with a logical signal of 0 V to 5 V. Therefore, a power-supply potential VSS2 of 13 V and a power-supply potential VDD2 of 18 V serving as power are supplied to a first logic circuit 2 and an analog circuit 3, and a power-supply potential VSS1 of 0 V and a power-supply potential VDD1 of 5 V serving as power are supplied to a second logic circuit 4. In this case, all the circuits are operated at an amplitude of 5 V; however, it is practically difficult to input, from an external circuit, a signal of 0 V to 5 V and a signal of 13 V to 18 V. Thus, the first input signal IN1 of 0 V to 5 V is converted to an output signal OUT of 13 V to 18 V by using a level shifter 1A, and the output signal OUT is supplied to the first logic circuit 2. The second logic circuit 4 is operated at a power-supply voltage VSS1 of 0 V and at a power-supply voltage VDD1 of 5 V, and controls the gate of the light emission control transistor Tr2 on the basis of the second input signal IN2 of 0 V to 5 V.

Figure 2:
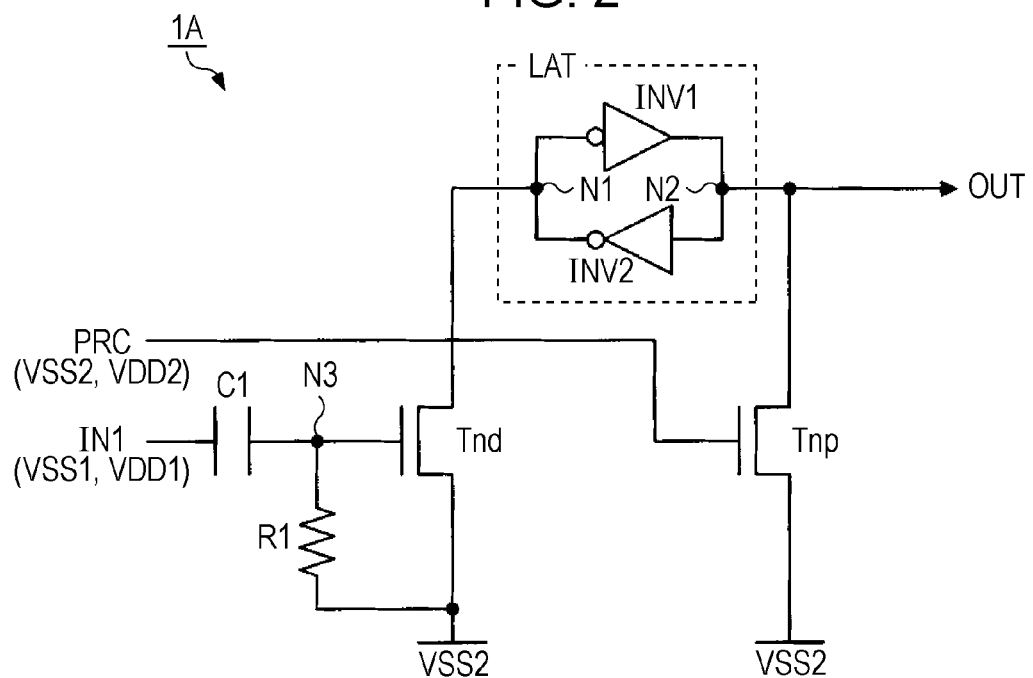
FIG. 2 is a schematic circuit diagram showing a structure of a level shifter.

FIG. 2 is a schematic circuit diagram showing a structure of the level shifter 1A. As shown in FIG. 2, the level shifter 1A includes a latch circuit LAT with an input node N1 and an output node N2. The latch circuit LAT includes an inverter INV1 whose input terminal is connected to the input node N1 and whose output terminal is connected to the output node N2, and an inverter INV2 whose input terminal is connected to the output node N2 and whose output terminal is connected to the input node N1. The inverters INV1 and INV2 are operated by receiving a power-supply potential VSS2 (a first output potential) and a power-supply potential VDD2 (a second output potential). The output signal OUT is extracted from the output node N2. The output signal OUT has a power-supply potential VDD2 as a high level and a power-supply potential VSS2 as a low level.

A transistor Tnd is provided between the input node N1 and a node to which the power-supply potential VSS2 is supplied. The transistor Tnd functions as a switching element which sets the electric potential of the input node N1 to the power-supply potential VSS2 in synchronization with a rising edge of the Input node N1. The first input signal IN1 is supplied to the gate of the transistor Tnd via a capacitive element C1. The gate of the transistor Tnd is connected to a node 43 to which the power-supply potential VSS2 is supplied via a resistor R1. The resistor R1 functions as a circuit for biasing the gate to the power-supply potential VSS2.

A transistor Tnp is provided between the output node N2 and a node to which the power-supply potential VSS2 is supplied. A precharge signal PRC is supplied to the gate of the transistor Tnp. The level of the precharge signal PRC becomes a high level (active) in a predetermined period just before a logic level of the input node N1 changes. The high level of the precharge signal PRC corresponds to the power-supply potential VDD2 and a low level of the precharge signal PRC corresponds to the power-supply potential VSS2. The transistor Tnp functions as a unit that precharges the output node N2 to be at an electric potential of the power-supply potential VSS2 before inversion of the first input signal IN1.

Figure 3:
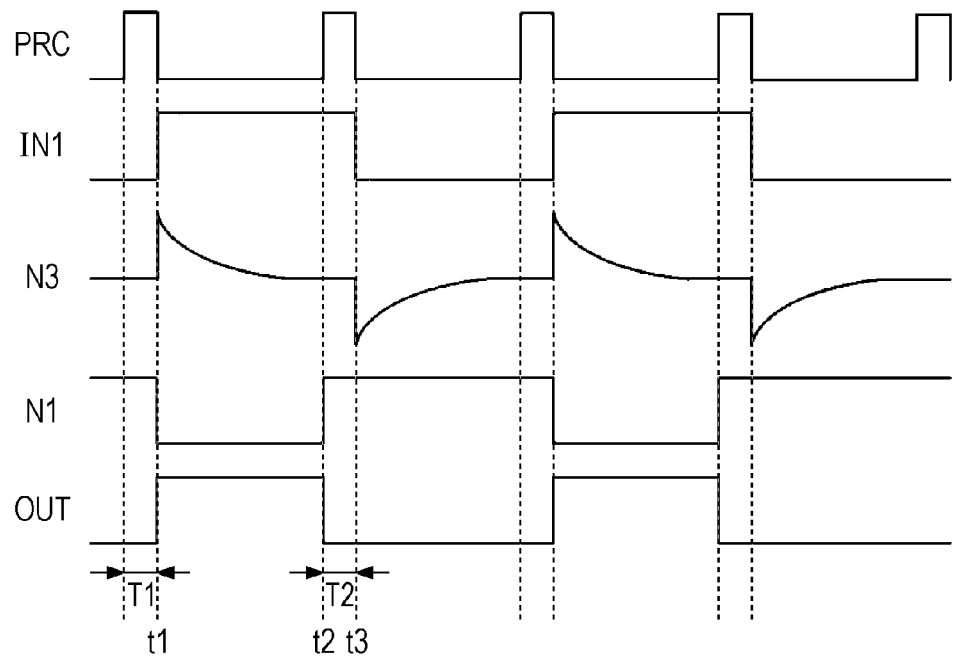
FIG. 3 is a timing chart showing waveforms at various positions in the level shifter.

FIG. 3 shows waveforms at various positions in the level shifter 1A. If the precharge signal PRC stays at the high level during a period T1, the transistor Tnp is changed to be in an ON state and the electric potential of the output node N2 is set to the low level (VSS2). In this case, the electric potential of the input node N1 is set to the high level (VDD2) by the inverter INV2. Because a waveform obtained by differentiating the first input signal IN1 is obtained at the node N3, if the first input signal IN1 rises from the low level to the high level at time t1, the electric potential of the node N3 rises with a pulse shape from the power-supply potential VSS2 Here, if a threshold voltage of the transistor Tnd is Vth1, when the electric potential of the node N3 exceeds VSS2+Vth1, the transistor Tnd is changed to be in an ON state and the electric potential of the input node N1 changes from the high level to the low level (VSS2). The latch circuit LAT maintains the electric potential of the input node N1 at the low level (VSS2) even if the electric potential of the node N3 becomes lower than VSS2+Vth1. Thus, the level of the output signal OUT becomes the high level (VDD2) at time t1.

The precharge signal PRC is changed from the low level to the high level at time t2, and stays at the high level during a period T2, During the period T2, similarly to the case during the period T1, the electric potential of the output node N2 is set to the low level (VSS2). This changes the electric potential of the input node N1 to be the high level (VDD2), and the electric potential of the output signal OUT to be the low level (VSS2). Afterwards, at time t3, when the level of the first input signal IN1 changes from the high level (VDD1) to the low level (VSS1), a negative pulse is obtained at the node N3. In this case, because the transistor Tnd maintains an OFF state, the electric potential of the input node N1 stays at the high level (VDD2). Afterwards, this operation is repeated to generate the output signal OUT.

The level shifter 1A sets the electric potential of the output node N2 to the low level (VSS2) by controlling the transistor Tnp with the precharge signal PRC. The precharge signal PRC becomes active during a period just before the logic level of the first input signal IN1 changes from the low level to the high level and during a period just before the logic level of the first input signal IN1 changes from the high level to the low level. That is, when the precharge signal PRC becomes active, memory content of the latch circuit LAT is coercively set to one of the logic levels. More specifically, the electric potential of the output node N2 is set to the low level, and the electric potential of the input node N1 is set to the high level. At the timing corresponding to changing of the level of the first input signal IN1 from the low level to the high level, the electric potential of the input node N1 is set to the low level and the memory content of the latch circuit LAT is updated. At the timing corresponding to changing of the level of the first input signal IN1 from the high level to the low level, the memory content of the latch circuit LAT is not updated.

As described above, according to the level shifter 1A of the first embodiment, the first input signal IN1 whose low level corresponds to VSS1 and whose high level corresponds to VDD1 can be converted to the output signal OUT whose low level corresponds to VSS2 and whose high level corresponds to VDD2. Moreover, because one capacitive element is sufficient in this embodiment, a structure of the level shifter according to the first embodiment can be simplified compared to that of a level shift circuit of the related art. If a capacitive element is mounted in an integrated circuit, the footprint of the capacitive element is relatively larger than the footprint of each of other elements therein. Because the level shifter 1A employs only one capacitive element, when the level shifter 1A is mounted in an IC, the footprint of the level shifter 1A can be largely reduced. Moreover, not only the electric potential of the input node N1 but also that of the output node N2 is controlled; therefore, memory, content of the latch circuit LAT can be assuredly updated.

Note that, the precharge signal PRC is a signal of VDD2 to VSS2. Thus, it is necessary to convert a level of the precharge signal PRC outside the level shifter 1A. For example, if the first input signal IN1 is a signal which is input to a plurality of data lines, the same number of level shifters 1A as the data lines are needed. In this case, the precharge signal PRC needs to be commonly supplied to all the level shifters 1A, if a level shift circuit of the related art is employed only for level conversion of the precharge signal PRC, the entire structure of the electro-optical device D can be simplified.

2. Second Embodiment

An electro-optical device D according to a second embodiment of the invention has a structure similar to that of the electro-optical device D according to the first embodiment of the invention except that a level shifter 1B is employed instead of the level shifter 1A.

Figure 4:
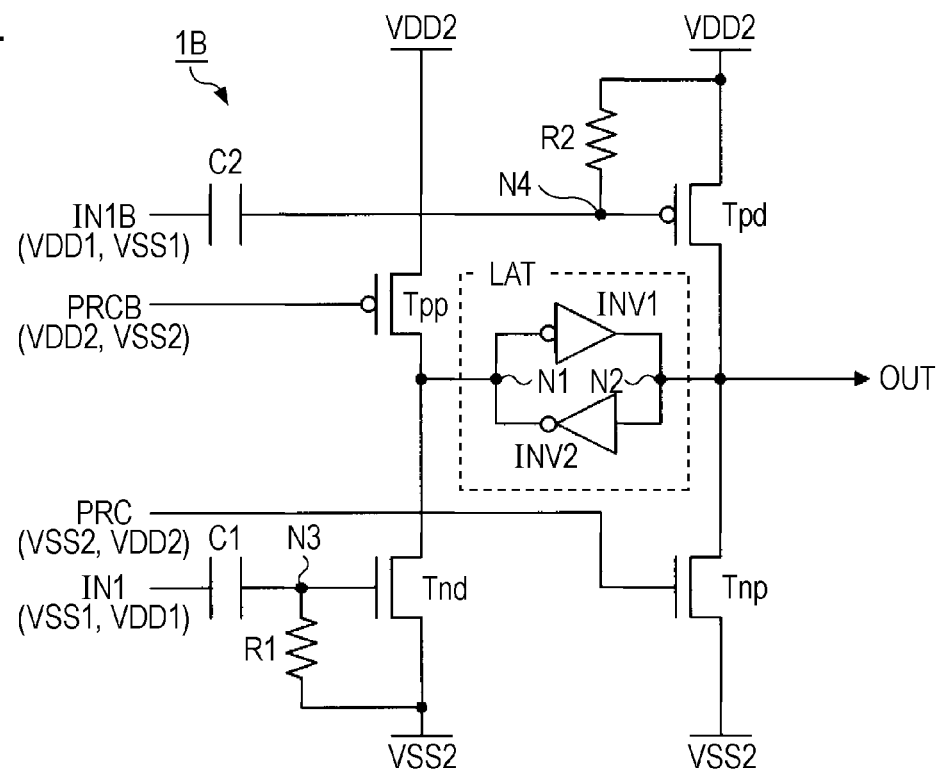
FIG. 4 is a schematic circuit diagram showing a structure of a level shifter according to a second embodiment of the invention.

FIG. 4 is a schematic circuit diagram showing a structure of the level shifter 1B. The level shifter 1B includes, in addition to the structure of the level shifter 1A, p-channel transistors Tpp and Tpd, a capacitive element C2, and a resistor R2.

The p-channel transistor Tpp is provided between a node to which a power-supply potential VDD2 is supplied and the input node N1. An inverted precharge signal PRCB obtained by inverting the precharge signal PRC is supplied to the gate of the p-channel transistor Tpp. Thus, when the inverted precharge signal PRCB becomes active (the periods T1 and T2 shown in FIG. 3), the p-channel transistor Tpp is changed to be in an ON state and the electric potential of the input node N1 is precharged to a high level (VDD2). Because the inverted precharge signal PRCB and the precharge signal PRC simultaneously become active, a logic level at the input node N1 and that at the output node N2 are set, and memory content of the latch circuit LAT is coercively set to one of the logic levels during a period just before the logic level of the first input signal IN1 changes.

Next, the p-channel transistor Tpd is provided between a node to which the power-supply potential VDD2 is supplied and the output node N2. An inverted input signal IN1B is supplied to the gate of the p-channel transistor Tpd via the capacitive element C2. Because the resistor R2 is provided between the gate of the p-channel transistor Tpd and a node N4 to which the power-supply potential VDD2 is supplied, the gate of the p-channel transistor Tpd is biased to the power-supply potential DD2. Thus, a signal at the node N4 is obtained by superimposing a differentiated waveform of the inverted input signal IN1B on the power-supply potential VDD2. Because the p-channel transistor Tpd is of a p-channel transistor, if the threshold voltage is Vth2, when the electric potential of the node N4 is below VDD2−Vth2, the p-channel transistors Tpd is changed to be in an ON state and the electric potential of the output node N2 is set to a high level (VDD2). Because the p-channel transistor Tpd is changed to be in the ON state at the timing corresponding to changing of the level of the inverted input signal IN1B from the high level to the low level, the p-channel transistor Tpd and the transistor Tnd are simultaneously changed to be in their ON states. Therefore, when the logic level of the first input signal IN1 is changed from the low level to the high level, the logic level at the input node N1 and that at the output node N2 are set, and the memory content of the latch circuit LAT is updated.

As described above, the level shifter 1B according to the second embodiment coercively sets, for both of the input node N1 and the output node N2, the memory content of the latch circuit LAT to one of the logic levels during a period just before the logic level of the first input signal IN1 changes. The level shifter 1B rewrites the memory content of the latch circuit LAT in synchronization with the timing corresponding to changing of the level of the first input signal IN1 from the low level to the high level. Therefore, the level shifter 1B can assuredly control the logic level of the output signal OUT compared to the case of the level shifter 1A.

The level shifter 1A sets only the electric potential of the input node N1 in synchronization with the timing corresponding to changing of the level of the first input signal IN1 from the low level to the high level. Thus, changing of the logic level of the first input signal IN1 is reflected in the output signal OUT after a propagation delay time has passed. In contrast, because the level shifter 1B controls the electric potential of the output node N2 with the p-channel transistor Tpd provided, the memory content of the latch circuit LAT is inverted at a high speed and the output signal OUT is obtained with only a short delay time.

3. Third Embodiment

An electro-optical device D according to a third embodiment of the invention has a structure similar to that of the electro-optical device D according to the first embodiment of the invention except that a level shifter 1C is employed instead of the level shifter 1A.

Figure 5:
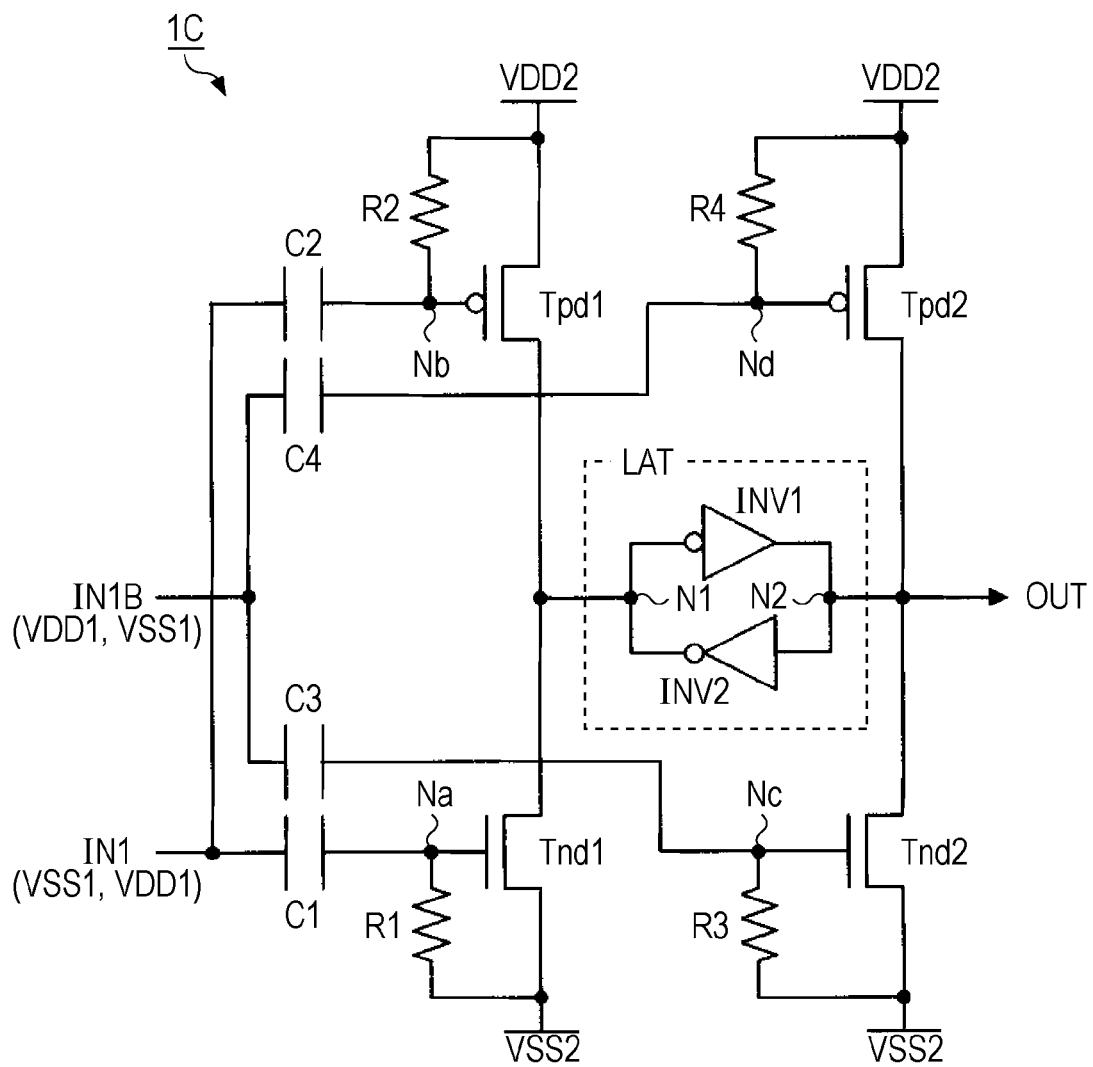
FIG. 5 is a schematic circuit diagram showing a structure of a level shifter according to a third embodiment of the invention.

FIG. 5 is a schematic circuit diagram showing a structure of the level shifter 1C. The level shifter 1C includes n-channel transistors Tnd1 and Tnd2, p-channel transistors Tpd1 and Tpd2, four capacitive elements C1 through C4, and four resistors R1 through R4.

The n-channel transistor Tnd1 is provided between the input node N1 of the latch circuit LAT and a node to which the power-supply potential VSS2 is supplied. The gate of the n-channel transistor Tnd1 is biased to the power-supply potential VSS2 via the resistor R1. The first input signal IN1 is supplied to the gate of the n-channel transistor Tnd1 via the capacitive element C1. The p-channel transistor Tpd1 is provided between the input node N1 and a node to which the power-supply potential VDD2 is supplied. The gate of the p-channel transistor Tpd1 is biased to the power-supply potential VDD2 via the resistor R2. The first input signal IN1 is supplied to the gate of the p-channel transistor Tpd1 via the capacitive element C2.

The n-channel transistor Tnd2 is provided between the output node N2 of the latch circuit LAT and a node to which the power-supply potential VSS2 is supplied. The gate of the n-channel transistor Tnd2 is biased to the power-supply potential VSS2 via the resistor R3. The inverted input signal IN1B is supplied to the gate of the n-channel transistor Tnd2 via the capacitive element C3. The p-channel transistor Tpd2 is provided between the output node N2 and a node to which the power-supply potential VDD2 is supplied. The gate of the p-channel transistor Tpd2 is biased to the power-supply potential VDD2 via the resistor R4. The inverted input signal IN1B is supplied to the gate of the p-channel transistor Tpd2 via the capacitive element C4.

At the timing corresponding to a rising edge of the first input signal IN1 (at the timing corresponding to a failing edge of the inverted input signal IN1B), a positive pulse is generated at a node Na and a negative pulse is generated at a node Nd. This causes the n-channel transistor Tnd1 and the p-channel transistor Tpd2 to be each changed to be in an ON state, the electric potential of the input node N1 to be set to a low level (VSS2), the electric potential of the output node N2 to be set to a high level (VDD2), and memory content of the latch circuit LAT to be updated.

Next, at the timing corresponding to a falling edge of the first input signal IN1 (at the timing corresponding to a rising edge of the inverted input signal IN1B), a negative pulse is generated at a node Nb, and a positive pulse is generated at a node Nc. This causes the p-channel transistor Tpd1 and the n-channel transistor Tnd2 to be each changed to be in an ON state, the electric potential of the input node N1 to be set to the high level (VDD2), the electric potential of the output node N2 to be set to the low level (VSS2), and the memory content of the latch circuit LAT to be updated.

As described above, the level shifter 1C sets and stores the logic level of each of the input node N1 and the output node N2 in synchronization with changing of the logic level of the first input signal IN1. Thus, the memory content of the latch circuit LAT can be assuredly updated, and reliability can be improved. Moreover, because the electric potential is set not only at the input node N1 but also at the output node N2, a propagation delay time of the level shifter 1C can be shortened.

4. Modified Embodiments

Various modifications may be added to the above-described embodiments. To be more specific, exemplary modifications are as follows.

1. In the above-described embodiments, the resistors R1 through R4 each function as a bias circuit for biasing the gate of the corresponding transistor; however, the invention is not limited to this. Any structure which can bias the gate is acceptable. For example, transistors or diodes may be employed instead of the resistors.

Figure 6A:
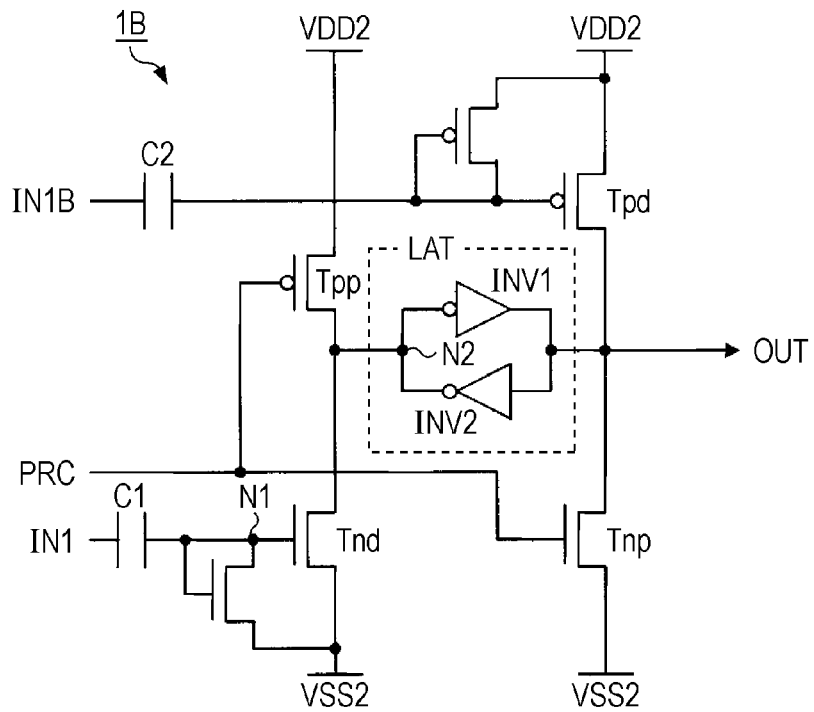
FIG. 6A is a schematic circuit diagram showing a structure of a level shifter according to a modification example.
Figure 6B:
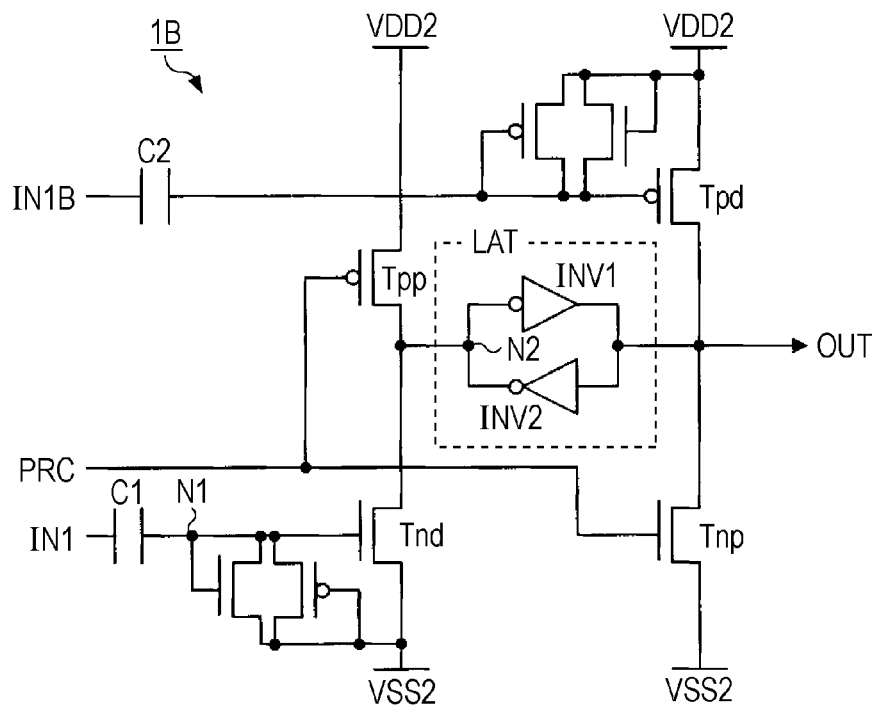
FIG. 6B is a schematic circuit diagram showing a structure of a level shifter according to a modification example.
Figure 7:
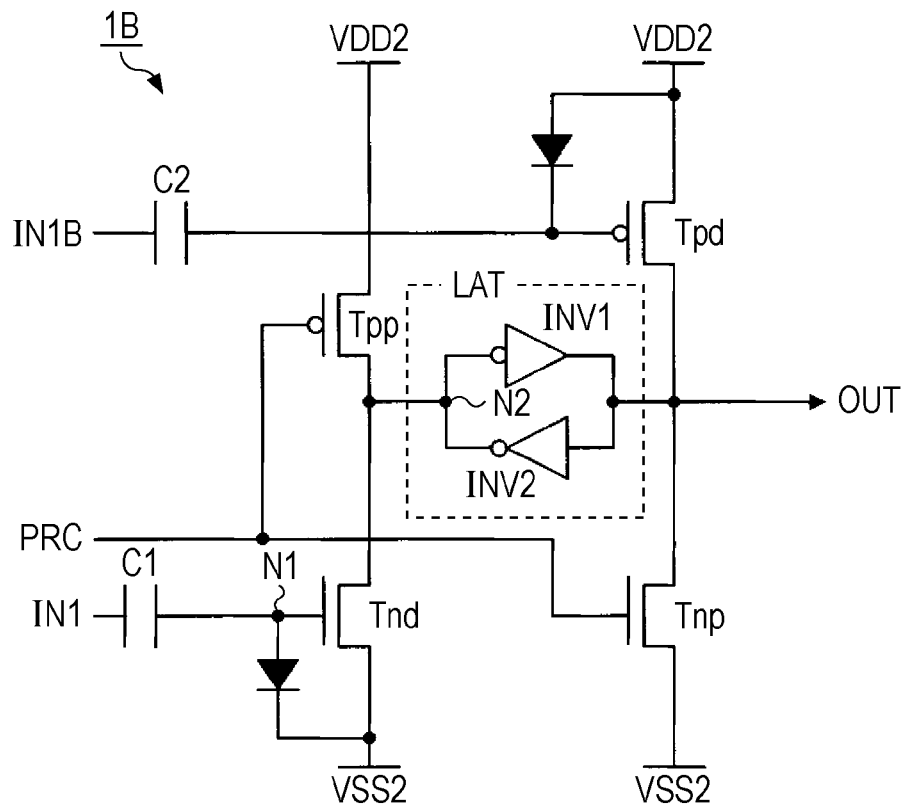
FIG. 7 is a schematic circuit diagram showing a structure of a level shifter according to a modification example.

FIGS. 6A and 6B show examples in which the resistors R1 and R2 of the level shifter 1B shown in FIG. 4 are replaced with transistors. In an example shown in FIG. 6A, the resistor R1 is replaced with an n-channel transistor, and the resistor R2 is replaced with a p-channel transistor. In an example shown in FIG. 6B, the resistors R1 and R2 are each replaced with an n-channel transistor and a n-channel transistor. In an example shown in FIG. 7, the resistors R1 and R2 are each replaced with a diode. Note that, the resistors of the level shifters 1A and 1C may also be replaced similarly.

Figure 8:
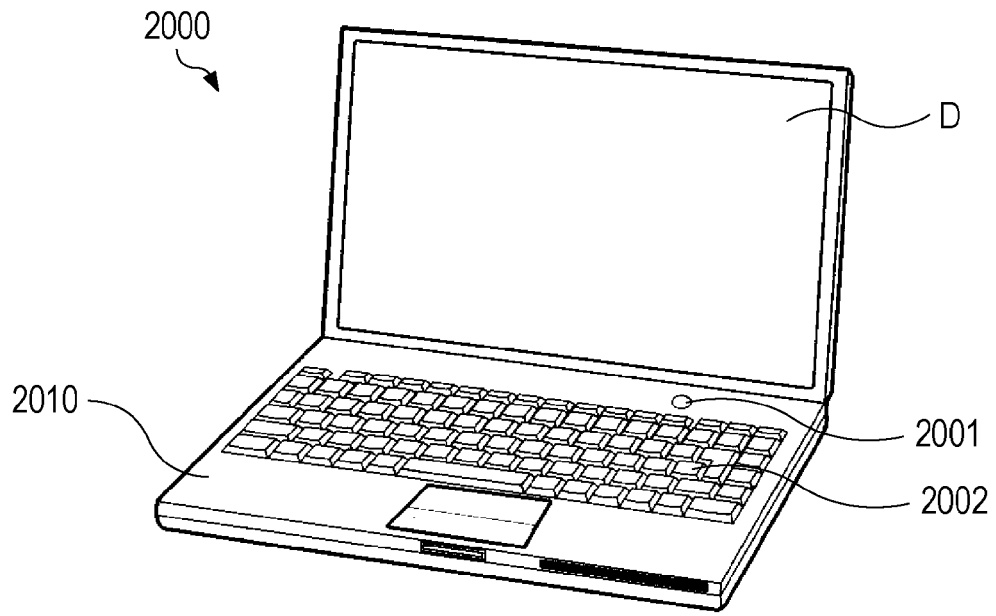
FIG. 8 is a perspective view showing a structure of a personal computer to which an embodiment of the invention is applied.
Figure 9:
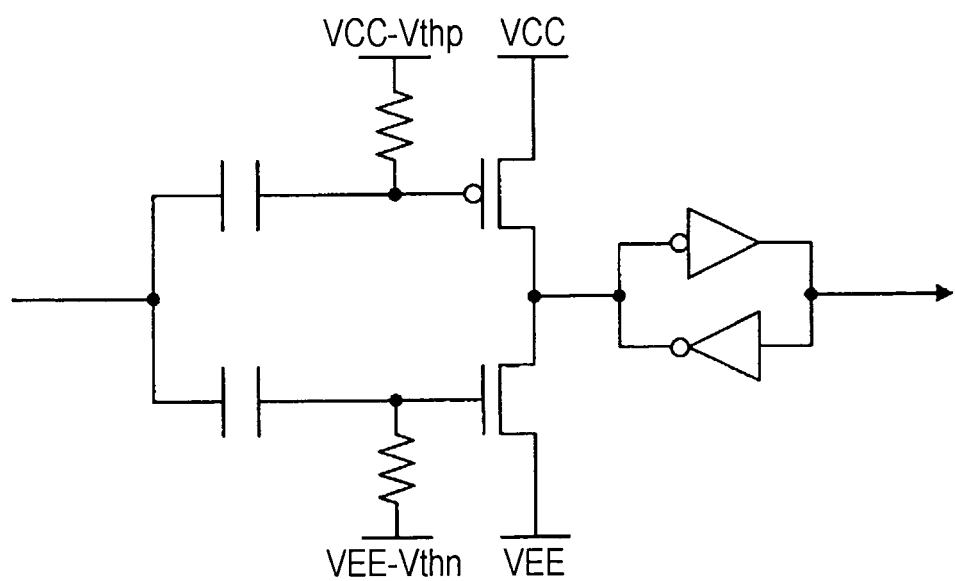
FIG. 9 is a schematic circuit diagram snowing a structure of a level shifter of the related art.

2. In the above-described embodiments, a specific example application of the electro-optical device D is a display device; however, the invention can also be applied to an apparatus such as a print head of an optical-writing printer or that of an electronic copying machine. FIG. 8 shows an exemplary electronic system to which an electro-optical device according to the invention is applied. The electronic system is a mobile personal computer in which the electro-optical device D is employed as a display device. A personal computer 2000 includes the electro-optical device D and a main unit 2010. The main unit 2010 includes a power switch 2001 and a keyboard 2002. Note that, other electronic systems to which the invention can be applied include a mobile phone, a personal digital assistant, a digital still camera, a television, a video camera, a car navigation system, a pager, an electronic notepad, electronic paper, a calculator, a word processor, a workstation, a videophone, a point-of-sale (POS) terminal, a printer, a scanner, a copier, a video player, a touch panel, and the like.

What is claimed is:

1. A level shift circuit that converts a level of an input signal, the input signal having a logic level at a first input electric potential and a logic level at a second input electric potential, and that generates an output signal, the output signal having a logic level at a first output electric potential corresponding to the first input electric potential and a logic level at a second output electric potential corresponding to the second input electric potential, the level shift circuit comprising:
a first power-supply node to which the first output electric potential is supplied;
a second power-supply node to which the second output electric potential is supplied;
a latch unit, having two inverters, each inverter having a single input, and the latch unit having an input node and an output node from which the output signal is output, the latch unit being configured to receive power from the first power-supply node and the second power-supply node and to maintain, if an electric potential of the input node is identical to one of the first output electric potential and the second output electric potential, an electric potential of the output node to be the other one of the first output electric potential and the second output electric potential;
a switching element that is provided between the first power-supply node and the input node and controlled to be in an ON state or an OFF state;
a control unit, positioned between a gate of the switching element and the first power-supply node, and that controls the switching element to be in the ON state at a timing corresponding to the time when the logic level of the input signal changes from the first input electric potential to the second input electric potential; and
a setting unit that receives a precharge signal and changes an electric potential of the output node to the first output electric potential in a predetermined period just before the logic level of the input signal changes, a high level of the precharge signal corresponding to a power-supply potential of the first output electric potential and a low level of the precharge signal corresponding to a power-supply potential of the first power-supply node.

2. The level shift circuit according to claim 1,
the switching element including a control terminal;
the control unit including:
(i) a bias circuit that biases the control terminal of the switching element to be at the first output electric potential; and
(ii) a capacitive element that includes a first terminal to which the control terminal of the switching element is connected and a second terminal to which the input signal is supplied.

3. The level shift circuit according to claim 1,
the setting unit including:
(i) a transistor that is provided between the first power-supply node and the output node, the transistor comprising a gate; and
(ii) a control signal having a logic level at the first output electric potential or at the second output electric potential, the logic level becoming the second output electric potential in a predetermined period of time just before the logic level of the input signal changes is supplied to the gate of the transistor.

4. The level shift circuit according to claim 1, the latch unit further including:
a first inverter having an input terminal that is connected to the input node and having an output terminal that is connected to the output node; and
a second inverter having an input terminal that is connected to the output node and having an output terminal that is connected to the input node.

5. An electro-optical device comprising:
the level shift circuit according to claim 1,
a level of a part of a signal supplied from outside the electro-optical device being converted by using the level shift circuit.

6. A level shift method that converts a level of an input signal and that generates an output signal by using a latch circuit, the input signal having a logic level at a first input electric potential and a logic level at a second input electric potential, the output signal having a logic level at a first output electric potential corresponding to the first input electric potential and a logic level at a second output electric potential corresponding to the second input electric potential, and the latch circuit, having two inverters, each inverter having a single input, and the latch circuit including an input node and an output node and maintaining, if an electric potential of the input node is identical to one of the first output electric potential and the second output electric potential, an electric potential of the output node to be the other one of the first output electric potential and the second output electric potential, the level shift method comprising:

provliding a switching element between the logic level at the first output electric potential and the input node, the switching element controlled to be in an ON state or an OFF state;

receiving a precharge signal;

setting the electric potential of the output node to the first output electric potential in a predetermined period of time just before the logic level of the input signal changes, a high level of the precharge signal corresponding to a power-supply potential of the first output electric potential and a low level of the precharge signal corresponding to a power-supply potential of the first power-supply node; and changing the electric potential of the input node, using a control unit that is positioned between a gate of the switching element and the logic level at the first output electric potential, to the first output electric potential in synchronization with a timing corresponding to the time when the logic level of the input signal changes from the first input electric potential to the second input electric potential.

* * * * *